United States Patent
Satoh

(10) Patent No.: US 10,333,534 B1
(45) Date of Patent: Jun. 25, 2019

(54) APPARATUSES AND METHODS FOR PROVIDING FREQUENCY DIVIDED CLOCKS

(71) Applicant: Micron Technology, Inc., Boise, ID (US)

(72) Inventor: Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/150,492

(22) Filed: Oct. 3, 2018

Related U.S. Application Data

(63) Continuation of application No. 15/851,126, filed on Dec. 21, 2017, now Pat. No. 10,141,942.

(51) Int. Cl.
| | | |
|---|---|---|
| *H03L 7/08* | (2006.01) | |
| *G06K 19/07* | (2006.01) | |
| *G06F 1/12* | (2006.01) | |
| *H03L 7/00* | (2006.01) | |
| *G06G 7/16* | (2006.01) | |
| *G06F 1/08* | (2006.01) | |
| *H03K 17/00* | (2006.01) | |
| *G05F 1/10* | (2006.01) | |
| *H03L 7/14* | (2006.01) | |
| *H03L 7/087* | (2006.01) | |

(Continued)

(52) U.S. Cl.
CPC .............. *H03L 7/143* (2013.01); *H03L 7/087* (2013.01); *H03L 7/18* (2013.01); *H04L 5/26* (2013.01); *H04L 7/04* (2013.01)

(58) Field of Classification Search
CPC . H03L 7/143; H03L 7/087; H03L 7/18; H04L 5/26; H04L 7/04

USPC .............. 327/2–12, 105–123, 141, 144–163; 331/15–17; 375/373–376

See application file for complete search history.

(56) References Cited

U.S. PATENT DOCUMENTS

| | | | | |
|---|---|---|---|---|
| 5,530,383 A | * | 6/1996 | May ........................ | H03L 7/095 327/156 |
| 6,624,705 B1 | * | 9/2003 | Huard ................... | H03L 7/0898 327/156 |

(Continued)

OTHER PUBLICATIONS

U.S. Appl. No. 15/851,126, entitled 'Apparatuses and Methods for Providing Frequency Divided Clocks', filed Dec. 21, 2017, pp. all.

(Continued)

*Primary Examiner* — Brandon S Cole
(74) *Attorney, Agent, or Firm* — Dorsey & Whitney LLP

(57) ABSTRACT

Apparatuses and methods for providing frequency divided clocks are described. An example apparatus includes a first circuit configured to provide a first intermediate clock responsive, at least in part, to a first input clock, the first intermediate clock being lower in frequency than the first input clock and further includes a second circuit configured to provide a second intermediate clock and a third intermediate clock responsive, at least in part, to a second input clock, the second intermediate clock being complementary to the third intermediate clock and lower in frequency than the second input clock. The apparatus further includes a third circuit configured to select and provide as an output clock one of the second and third intermediate clocks responsive, at least in part, to the first and second intermediate clocks.

18 Claims, 5 Drawing Sheets

(51) Int. Cl.
*H03L 7/18* (2006.01)
*H04L 5/26* (2006.01)
*H04L 7/04* (2006.01)

(56) References Cited

U.S. PATENT DOCUMENTS

| | | | | |
|---|---|---|---|---|
| 7,843,239 | B2* | 11/2010 | Sohn | G06G 7/16 327/147 |
| 8,134,393 | B1* | 3/2012 | Nagaraj | H03L 7/083 327/147 |
| 8,542,040 | B1* | 9/2013 | O'Day | H03K 23/667 327/115 |
| 10,141,942 | B1 | 11/2018 | Satoh | |
| 2003/0117195 | A1* | 6/2003 | Chang | H03L 7/081 327/159 |
| 2007/0030041 | A1* | 2/2007 | Huang | H03K 5/133 327/158 |
| 2009/0167384 | A1* | 7/2009 | Sohn | G06G 7/16 327/156 |
| 2012/0212268 | A1 | 8/2012 | Kim | |

OTHER PUBLICATIONS

PCT Application No. PCT/US2018/066408, titled "Apparatuses and Methods for providing Frequency Divided Clocks" filed Dec. 19, 2018, pp. all.
International Search Report and Written Opinion for PCT application No. PCT/US2018/066408 dated Apr. 15, 2019; pp. all.

* cited by examiner

APPARATUSES AND METHODS FOR PROVIDING FREQUENCY DIVIDED CLOCKS

CROSS-REFERENCE TO RELATED APPLICATION(S)

This application is a continuation of U.S. patent application Ser. No. 15/851,126, filed on Dec. 21, 2017 and issued as U.S. Pat. No. 10,141,942 on Nov. 27, 2018. The aforementioned application, and issued patent, is incorporated herein by reference, in its entirety, and for any purposes.

BACKGROUND

Periodic digital signals are commonly used in a variety of electronic devices, such as memory devices. Probably the most common of periodic digital signals are clocks that are typically used to establish the timing of a digital signal or the timing at which an operation is performed on a digital signal. For example, data signals are typically coupled to and from memory devices in synchronism with a clock or data strobe.

Clock circuits included in the electronic device provide internal clocks that are used for timing various operations. The internal clocks may be based on external clocks provided to the electronic device. An example clock circuit may include a delay-locked loop (DLL). A typical DLL uses a delay line including a large number of delay stages. A reference clock is applied to the delay line, and it propagates through the delay line to the final delay stage, which outputs a delayed clock. The phase of the delayed clock is compared to the phase of the reference clock to generate a phase error signal. The phase error signal is used to adjust the delay provided by the delay stages in the delay line until the phase of the delayed clock is locked to the phase of the reference clock. The DLL is considered to have obtained a locked condition when this occurs. The delayed clock may then be provided to other circuits of the electronic device for timing operations.

As the operating speed of electronic devices increases, the frequencies of clock signals needed to operate the electronic devices at these higher speeds also increase. One difficulty encountered with these higher clock speeds is the difficulty for circuits of a DLL to determine a phase relationship between the delayed clock and reference clock for adjusting delay.

An approach that has been used to alleviate this problem is to divide a higher frequency clock to generate lower frequency clocks having clock transitions that coincide with clock transitions of the higher frequency clock. Typical clock divider circuits included in DLLs, however, provide divided clocks having unpredictable phase relationships with the higher frequency clock, which may result in longer than desirable time for the DLL to reach a locked condition. Therefore, it may be desirable to have alternative designs for clock divider circuits and DLLs.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
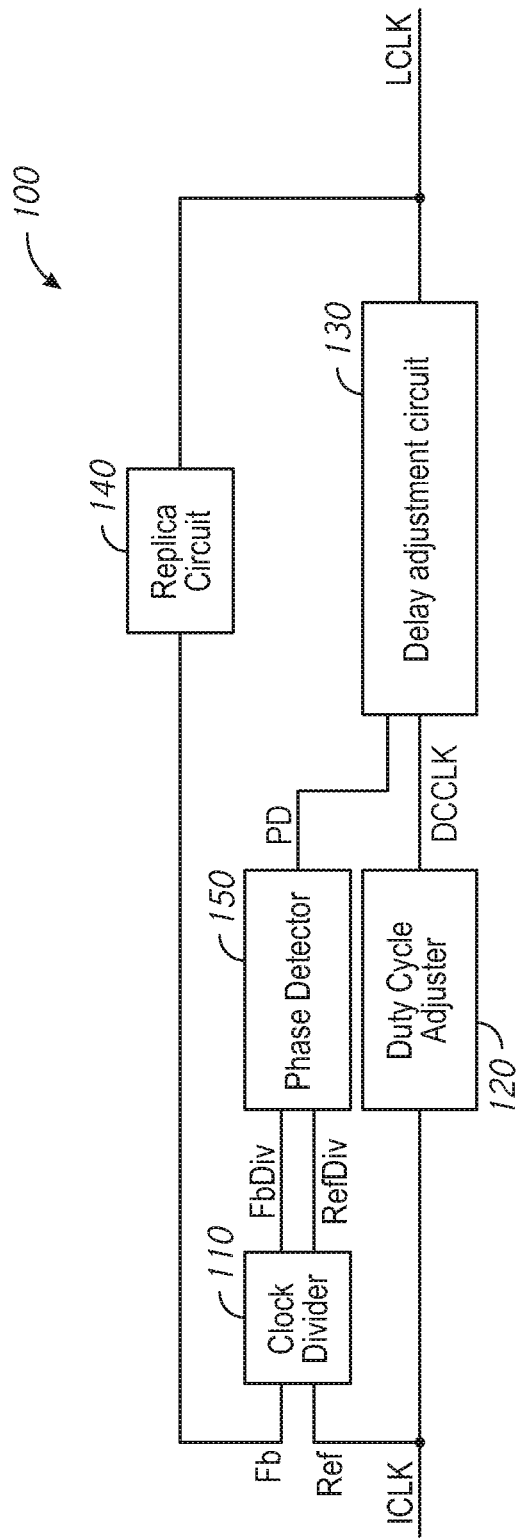
FIG. 1 is a block diagram of a delay-locked loop (DLL) according to an embodiment of the disclosure.

FIG. 1 is a block diagram of a delay-locked loop (DLL) 100 according to an embodiment of the disclosure. The DLL 100 receives an input clock ICLK and provides an output clock LCLK responsive to the ICLK clock. The LCLK clock has a delay relative to the ICLK clock, and the LCLK clock is synchronized with the ICLK clock.

The DLL 100 includes a clock divider circuit 110 that is provided with the ICLK clock as a reference clock Ref. When enabled, the clock divider circuit 110 provides a divided frequency clock RefDiv having a clock frequency that is less than the clock frequency of the Ref clock (i.e., the ICLK clock). For example, the clock divider circuit 110 may divide the clock frequency of the ICLK clock in half to provide the RefDiv clock having a clock frequency one-half the clock frequency of the ICLK clock. The clock divider circuit 110 may be enabled by a controller circuit (not shown) when, for example, an active LCLK clock is to be provided by the DLL 100.

The ICLK clock is also provided to a duty cycle adjuster (DCA) circuit 120. The DCA circuit 120 adjusts a duty cycle of the ICLK clock to provide a duty cycle corrected clock DCCLK. The DCCK clock may be duty cycle corrected, for example, to have a 50% duty cycle. The DCCLK clock is provided to a delay adjustment circuit 130. In applications where the correction of duty cycle is not necessary, the DCA circuit 120 may be omitted and the ICLK clock may be provided to the delay adjustment circuit 130 without duty cycle correction.

The delay adjustment circuit 130 may include an adjustable delay circuit and a delay control circuit to add delay to the DCCLK clock to provide the LCLK clock. The LCLK clock is provided to a replica circuit 140 that adds a delay to the LCLK clock to provide a feedback clock Fb. The replica circuit 140 provides a delay to the LCLK clock that models propagation delays in the clock paths for the ICLK and LCLK clocks. The propagation delay may result from the ICLK and LCLK clocks propagating through various circuits in the clock paths. The Fb clock is provided to the clock divider circuit 110, which divides the clock frequency of the Fb clock to provide a divided frequency clock FbDiv that has a lower clock frequency than the Fb clock. For example, as with the previous example for the RefDiv clock, the clock divider circuit 110 may provide the FbDiv clock having one-half the clock frequency of the Fb clock.

The RefDiv and FbDiv clocks are provided to a phase detector 150 that compares the phases of the RefDiv and FbDiv clocks relative to one another and provides a phase difference signal PD having a value indicative of the phase relationship between the RefDiv and FbDiv clocks. For example, the PD signal may have a first logic level when the RefDiv clock leads the FbDiv clock and the PD signal may have a second logic level when the RefDiv clock lags the FbDiv clock. The PD signal is provided to the delay adjustment circuit 130. A delay control circuit of the delay adjustment circuit 130 may use the PD signal to determine how to adjust the adjustable delay circuit of the delay adjustment circuit 130. Changing the delay of the adjustable delay circuit of the delay adjustment circuit 130 changes the timing of the LCLK clock relative to the DCCLK clock, which in turn, changes the relative phases of the RefDiv and FbDiv clocks. Typically, the adjustable delay circuit of the delay adjustment circuit 130 includes several delay units, with each delay unit adding an incremental delay when activated. Delay may be incrementally changed by the delay control circuit by enabling or disabling the delay units. The adjustable delay is adjusted until the RefDiv and FbDiv clocks are in phase, at which point, the DLL is considered locked. The delay control circuit ceases adjusting the adjustable delay of the delay adjustment circuit when a locked condition is obtained.

Reducing the clock frequency of the Ref and Fb clocks to provide the RefDiv and FbDiv clocks (e.g., having one-half the clock frequency of the Ref and Fb clocks) provides greater performance margin for the phase detector 150 in detecting the phases of the reference and feedback clocks. By slowing down the Ref and Fb clocks to provide the RefDiv and FbDiv clocks, the phase detector 150 has effectively more time to compare and accurately determine the phase relationship between the reference and feedback clocks when providing the PD signal.

However, if the clock divider 110 is configured to simply divide each of the Ref and Fb clocks as a conventional clock divider circuit, the DLL 100 may be susceptible to overly long lock scenarios. That is, in some situations, the DLL 100 may require significant time to obtain a locked condition because of the unpredictable phase of the FbDiv clock provided by the clock divider circuit 110 relative to the RefDiv clock.

Figure 2:
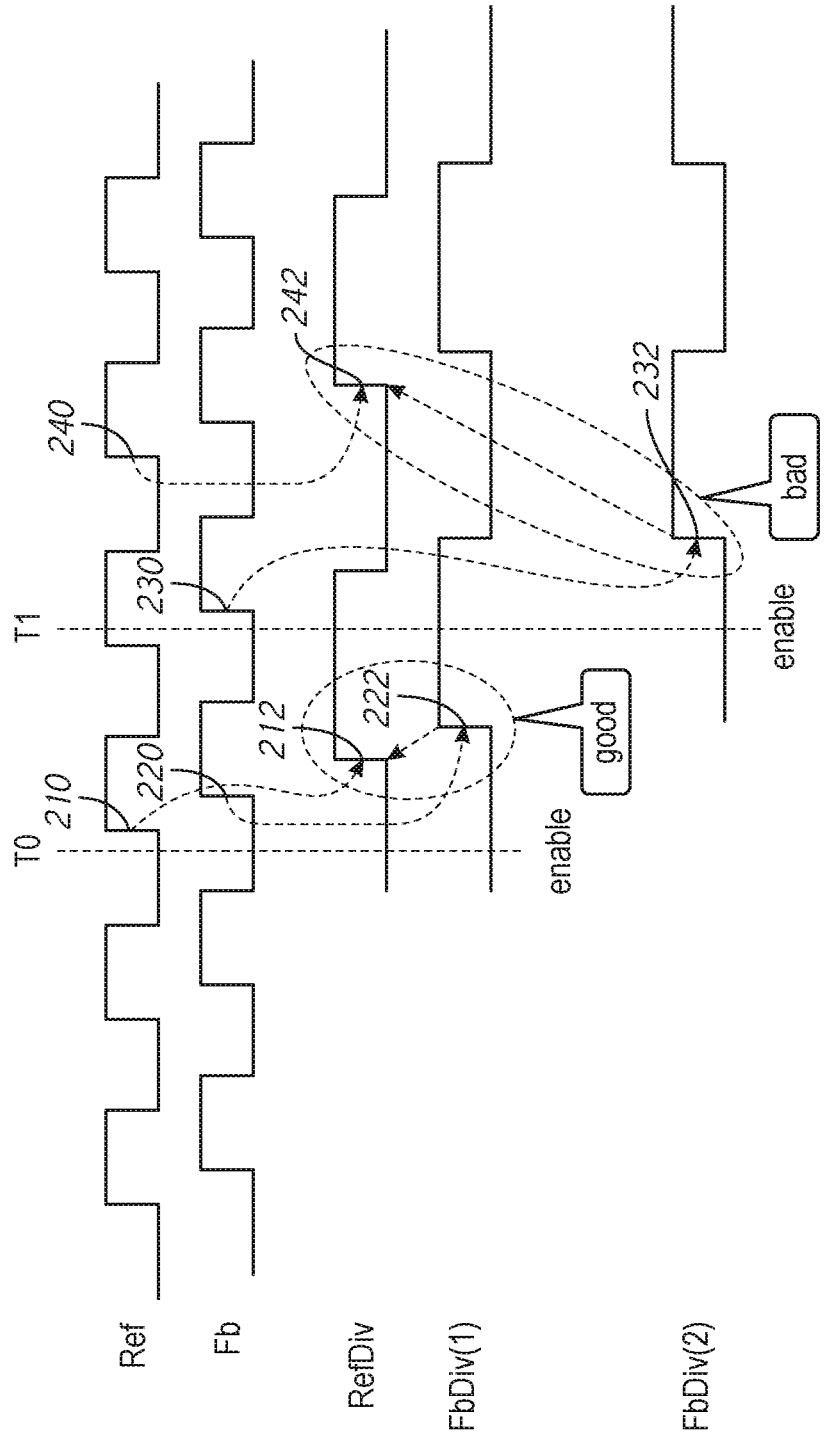
FIG. 2 is a timing diagram of various clocks during operation of the DLL of FIG. 1.

FIG. 2 is a timing diagram of various clocks during operation of the DLL 100 of FIG. 1 using a conventional clock divider circuit for the clock divider circuit 110. FIG. 2 will be referenced in describing the long lock scenario for DLL 100 previously mentioned. FIG. 2 illustrates the Ref and Fb clocks provided to the clock divider circuit 110, and further shows the divided clocks RefDiv and FbDiv provided by the divider circuit 110. Two cases for a conventional clock divider circuit are shown for the FbDiv clock, FbDiv(1) and FbDiv(2). The FbDiv(1) clock and the FbDiv(2) clock are complementary. The phase of the FbDiv clock provided by the conventional clock divider circuit is not predictable, and may have the phase of the FbDiv(1) clock or the FbDiv(2) clock.

As shown in FIG. 2, when the clock divider circuit 110 is enabled, such as at time T0, the clock divider circuit 110 provides the RefDiv and FbDiv clocks having one-half the clock frequency of the Ref and Fb clocks. Following the clock divider circuit 110 being enabled, a first rising clock edge received by the clock divider circuit 110 is rising clock edge 210 of the Ref clock, which results in a rising clock edge 212 of the RefDiv clock. Similarly, a rising clock edge 220 of the Fb clock that is received following the Ref clock results in a rising clock edge 222 of the FbDiv(1) clock. The resulting RefDiv clock leads the resulting FbDiv(1) clock, as shown in FIG. 2. The RefDiv and FbDiv clocks are provided to the phase detector 150, which provides the PD signal indicative of the phase relationship between the RefDiv and FbDiv clocks. Based on the PD signal, the delay control circuit of the delay adjustment circuit 130 adjusts the delay DCCLK to change the phase relationship of the Ref clock (on which the DCCLK is based) and the Fb clock (based on the LCLK clock provided by the delay adjustment circuit 130). The process of incrementally adjusting the delay of the delay adjustment circuit 130 and determining the phase relationship between the RefDiv and FbDiv clocks to provide the PD signal is iteratively performed until the rising edges 212 and 222 of the RefDiv and FbDiv clocks are aligned, which results in the Ref and Fb clocks being synchronized. With reference to the example of the FbDiv(1) clock, the clock edges of the RefDiv and FbDiv(1) clocks may be aligned relatively quickly in order to synchronize the Ref and Fb clocks and have the DLL 100 obtain a locked condition.

In contrast, if the clock divider circuit 110 is enabled at time T1 rather than at time T0, a condition for a long lock scenario is created. The clock divider circuit 110 is enabled when the first rising clock edge received by the clock divider circuit 110 is rising clock edge 230 of the Fb clock. At a time following the rising clock edge 230, the clock divider circuit 110 receives rising clock edge 240 of the Ref clock. The resulting rising edge 232 of the FbDiv(2) clock provided by the clock divider circuit 110 leads the resulting rising edge 242 of the RefDiv clock by a significant amount of time (i.e., time difference between rising edges 232 and 242). In order to align the rising clock edges of the RefDiv and FbDiv(2) clocks, the delay of the delay adjustment circuit 130 will need to be incrementally adjusted many times until sufficient delay is added to align the rising clock edges of the RefDiv and FbDiv(2) clocks. The lengthy time due to the repetitive delay adjustments in order to synchronize the Ref and Fb clocks results in a long lock scenario for the DLL 100.

As illustrated by the two cases for FbDiv(1) and FbDiv(2) described with reference to FIG. 2, the second case results in an undesirable long lock scenario.

Figure 3:
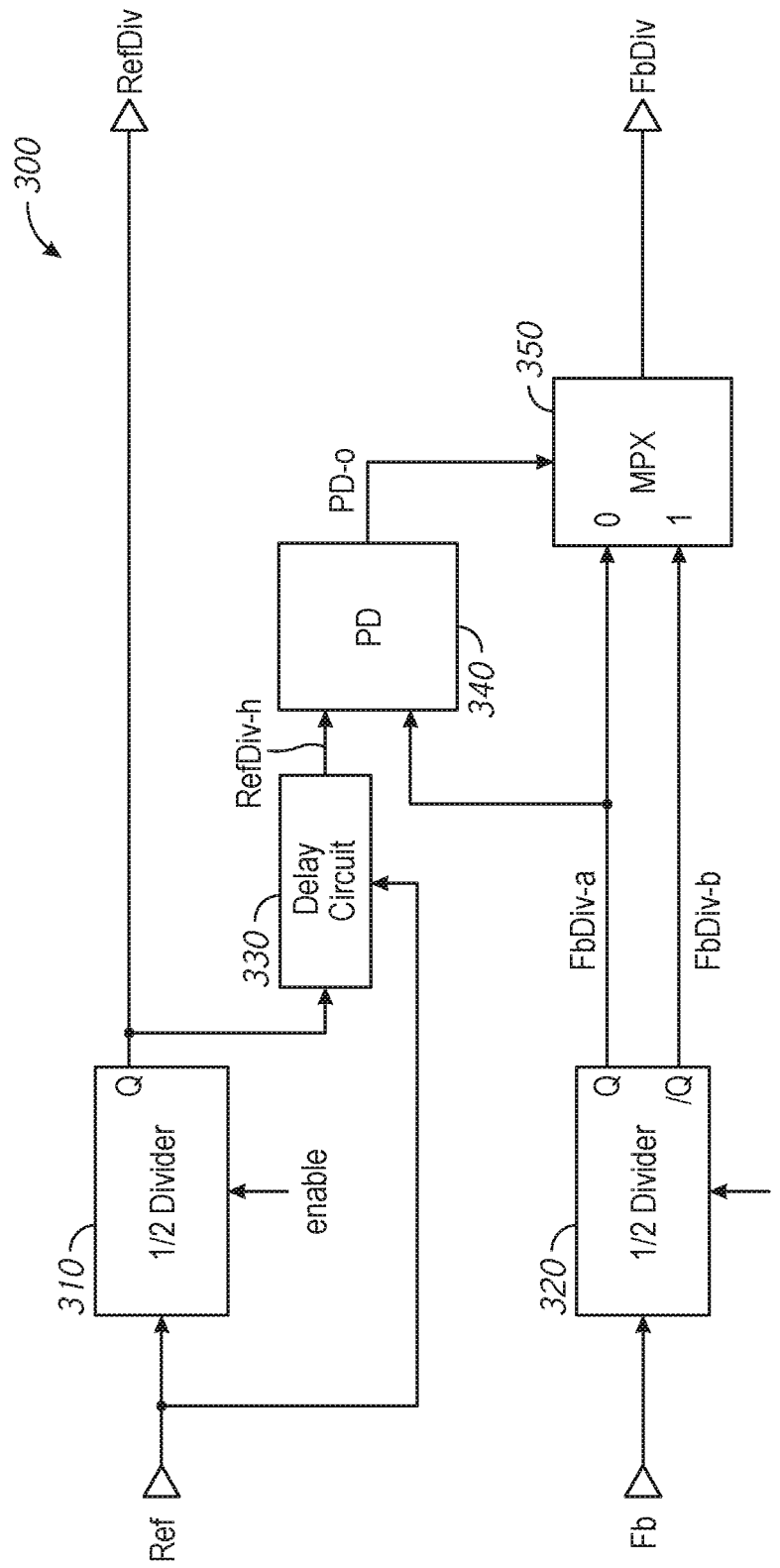
FIG. 3 is a block diagram of a clock divider circuit according to an embodiment of the disclosure.

FIG. 3 is a block diagram of a clock divider circuit 300 according to an embodiment of the disclosure. The clock divider circuit 300 may be included in the clock divider circuit 110 of the DLL 100 rather than a conventional clock divider circuit to provide a DLL according to an embodiment of the disclosure.

The clock divider circuit 300 includes a divider circuit 310 that receives a reference clock Ref clock, and when enabled by an active enable signal, provides a divided clock RefDiv having one-half the clock frequency of the Ref clock. The clock divider circuit 300 further includes a divider circuit 320 that receives a feedback clock Fb, and when enabled by an active enable signal, provides a divided clock FbDiv-a and a divided clock FbDiv-b, both having one-half the clock frequency of the Fb clock. The FbDiv-b clock is complementary to the FbDiv-a clock.

A delay circuit 330 is provided with the Ref clock and the RefDiv clock from the divider circuit 310. The delay circuit 330 provides a delayed clock RefDiv-h. The RefDiv-h clock has a delay of one-half the clock cycle of the Ref clock relative to the RefDiv clock. The RefDiv-h clock is provided to a phase detector 340, which compares the phases of the RefDiv-h clock and FbDiv-a clock. The phase detector 340 provides a phase difference signal PD-o having a value indicative of the phase relationship of the RefDiv-h clock and FbDiv-a clock. For example, the PD-o signal has a logical "0" value (e.g., a low logic level) when the RefDiv-h clock lags the FbDiv-a clock and has a logical "1" value (e.g., a high logic level) when the RefDiv-h clock leads the FbDiv-a clock. The delay circuit 330 may be included with the phase detector 340 in some embodiments of the disclosure. The delay circuit 330 may be a separate circuit, or included with another circuit in other embodiments of the disclosure.

A multiplexer 350 receives the FbDiv-a and FbDiv-b clocks from the divider circuit 320 and provides one of the FbDiv-a and FbDiv-b clocks as a divided clock FbDiv based on the PD-o signal.

By comparing the phases of the RefDiv-h clock and the FbDiv-a clock, the phase detector 340 may be effectively comparing the phases of the Ref clock with the Fb clock. For example, when the Ref clock leads the Fb clock by less than one-half the clock cycle of the Ref clock (e.g., a falling clock edge of the Ref clock lags a rising clock edge of the Fb clock), the RefDiv-h clock lags the FbDiv-a clock (e.g., a rising clock edge of the RefDiv-h clock lags a rising clock edge of the FbDiv-a clock), and when the Ref clock leads the Fb clock by more than one-half the clock cycle of the Ref clock (e.g., a falling clock edge of the Ref clock leads a rising clock edge of the Fb clock), the RefDiv-h clock leads the FbDiv-a clock (e.g., a rising clock edge of the RefDiv-h clock leads a rising clock edge of the FbDiv-a clock). As a result, the phase detector 340 provides a low logic level PD-o signal when the Ref clock leads the Fb clock by less than one-half the clock cycle of the Ref clock (e.g., a falling clock edge of the Ref clock lags a rising clock edge of the Fb clock) and provides a high logic level PD-o signal when the Ref clock leads the Fb clock by more than one-half the clock cycle of the Ref clock (e.g., a falling clock edge of the Ref clock leads a rising clock edge of the Fb clock).

Figure 4:
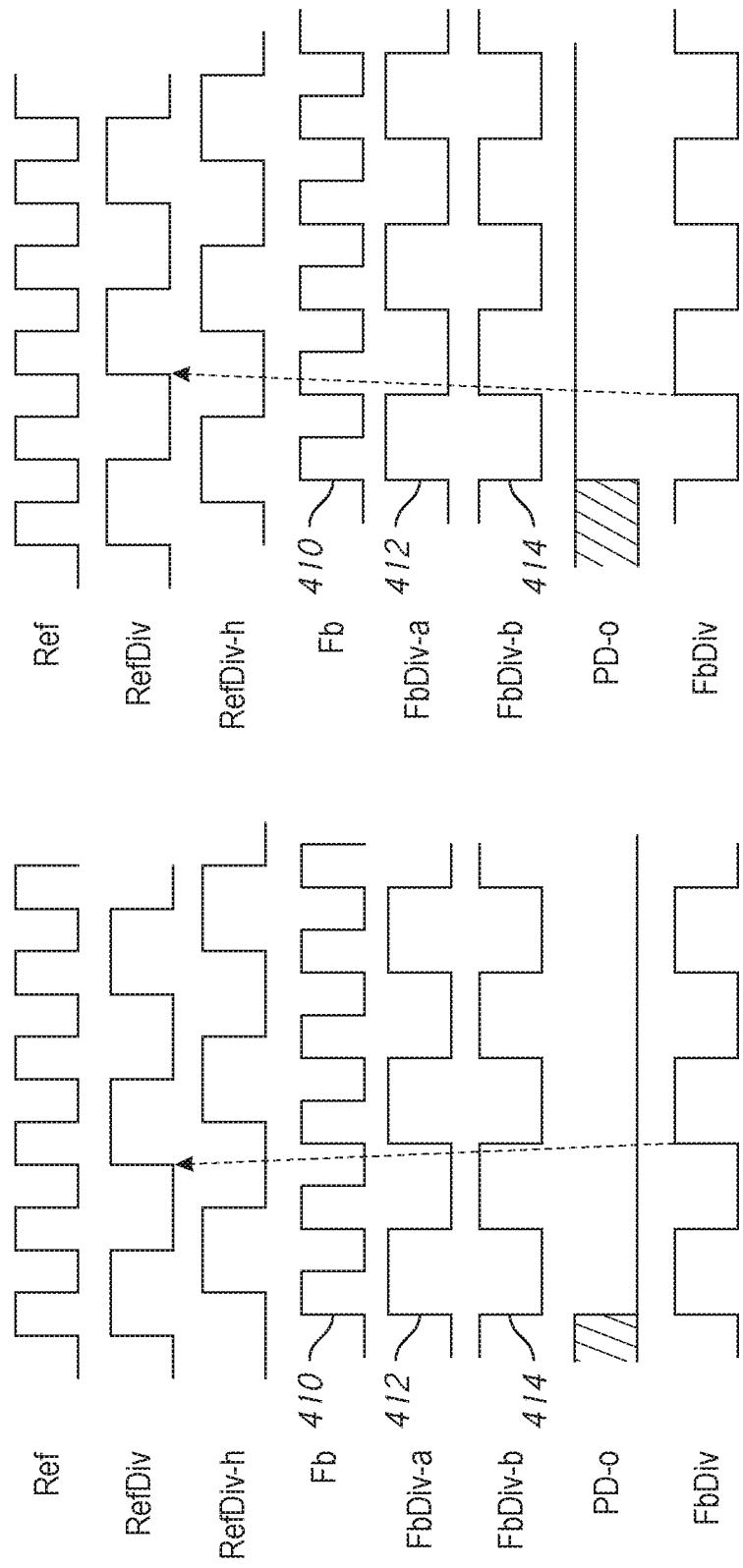
FIGS. 4A and 4B are timing diagrams of various clocks and a phase difference signal during operation of the clock divider circuit of FIG. 3 according to an embodiment of the disclosure.

FIGS. 4A and 4B are timing diagrams of various clocks and the PD-o signal during operation of the clock divider circuit 300 according to an embodiment of the disclosure. FIG. 4A illustrates the timing of various clocks and the PD-o signal when the divider circuits 310 and 320 are enabled by the active enable signal at a time when a rising clock edge of the Fb clock occurs while the Ref clock is at a high clock level (e.g., a falling clock edge of the Ref clock lags a rising clock edge of the Fb clock). FIG. 4B illustrates the timing of various clocks and the PD-o signal when the divider circuits 310 and 320 are enabled by the active enable signal at a time when a rising edge of the Fb clock occurs while the Ref clock is at a low clock level (e.g., a falling clock edge of the Ref clock leads a rising clock edge of the Fb clock).

With reference to FIG. 4A, when the divider circuits 310 and 320 are enabled, the divider circuit 310 provides the RefDiv clock having one-half the clock frequency of the Ref clock and the divider circuit 320 provides the FbDiv-a and FbDiv-b clocks having one-half the clock frequency of the Fb clock. A rising edge 412 of the in-phase FbDiv-a clock corresponds to the rising edge 410 of the Fb clock and a falling edge 414 of the complementary FbDiv-b clock corresponds to the rising edge 410 of the Fb clock.

As shown in FIG. 4A, the RefDiv clock is delayed by one-half the clock period of the Ref clock by the clock delay circuit 330 to provide the RefDiv-h clock. As a result, the RefDiv-h clock lags the FbDiv-a clock, causing the phase detector 340 to provide a low logic level PD-o signal. The RefDiv-h clock lagging the FbDiv-a clock represents a condition where falling clock edges of the Ref clock lag rising clock edges of the Fb clock (and the Ref clock leads the Fb clock by less than one-half the clock cycle of the Ref clock). The multiplexer circuit 350 is controlled by the low logic level PD-o signal to provide the FbDiv-a clock as the FbDiv clock. The FbDiv-a clock lags the RefDiv clock by an amount that may be quickly adjusted out by changing the timing of the FbDiv and RefDiv clocks relative to one another. For example, in an embodiment of the disclosure where the clock divider circuit 300 is included in the clock divider circuit 110 rather than a conventional clock divider circuit, the RefDiv and FbDiv clocks may be provided to the phase detector 150 of the DLL 100 to provide the PD signal used to adjust delay of the delay adjustment circuit 130 to change the timing of the DCCLK clock. As the timing of the DCCLK clock changes, the timing of the resulting LCLK clock and Fb clock also changes until the RefDiv and FbDiv clocks are synchronized. When this occurs, the Ref and Fb clocks are also synchronized and the DLL 100 obtains a locked condition.

In contrast to the example of FIG. 4A, the example of FIG. 4B shows the RefDiv-h clock leading the FbDiv-a clock. As previously described, with respect to FIG. 4B, the clock dividers 310 and 320 are enabled by the active enable signal at a time when the rising clock edge 410 of the Fb clock occurs while the Ref clock has a high clock level, which results in the RefDiv-h clock leading the FbDiv-a clock in the example. The RefDiv-h clock leading the FbDiv-a clock represents a condition where falling clock edges of the Ref clock lead rising clock edges of the Fb clock (and the Ref clock leads the Fb clock by more than one-half the clock cycle of the Ref clock). The leading RefDiv-h clock causes the phase detector 340 to provide a high logic level PD-o signal to the multiplexer 350, which provides the FbDiv-b clock as the FbDiv clock because of the high logic level PD-o signal. The FbDiv clock leads the RefDiv clock by an amount that may be quickly adjusted out by changing the timing of the FbDiv and RefDiv clocks relative to one another. With reference to an embodiment of the disclosure where the clock divider circuit 300 is included in the clock divider circuit 110 rather than a conventional clock divider circuit, the delay adjustment circuit 130 is controlled by the PD signal provided by the phase detector 150 to change the timing of the DCCLK clock until the Ref and Fb clocks are synchronized and the DLL 100 obtains a locked condition, as previously described.

The examples of FIGS. 4A and 4B illustrate an advantage provided by using the clock divider circuit 300, for example, in clock circuits such as DLLs. The clock divider circuit 300 provides clocks having lower clock frequency (e.g., one-half the clock frequency of an input clock), which may result in greater margin for a phase detector in detecting the relative phases of a reference clock and a feedback clock based on the reference clock. As previously described, conventional clock divider circuits provide divided clocks that may have unpredictable phase relationships that cause long lock scenarios. However, in contrast to conventional clock divider circuits, the clock divider circuit 300 provides one of two feedback clocks based on the phase relationship between the reference and feedback clocks (which may be represented by clocks based on the reference and feedback clocks). In some embodiments of the disclosure, the reference and feedback clocks may be represented by a clock based on the reference clock (e.g., the RefDiv-h clock) and one of the two feedback clocks (e.g., the FbDiv-a clock). The selected feedback clock may reduce the likelihood of long lock scenarios.

Figure 5:
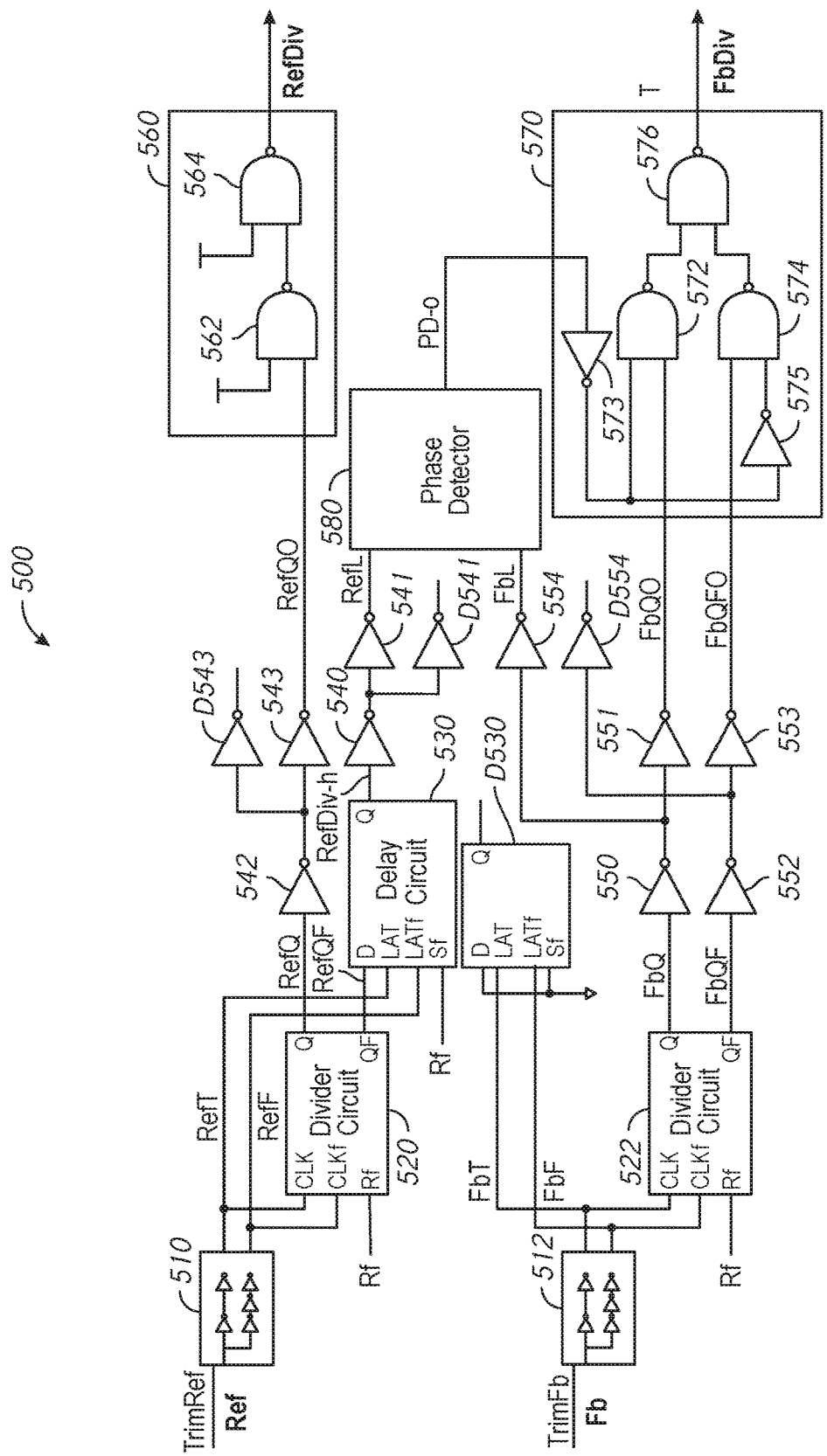
FIG. 5 is a schematic diagram of a clock divider circuit according to an embodiment of the disclosure.

FIG. 5 is a schematic diagram of a clock divider circuit 500 according to an embodiment of the disclosure. The clock divider circuit 500 may be included in the clock divider circuit 110 of the DLL 100 rather than a conventional clock divider circuit to provide a DLL according to an embodiment of the disclosure.

The clock divider circuit 500 includes phase splitter circuits 510 and 512. The phase splitter circuit 510 receives a reference clock Ref and provides complementary reference clocks RefT and RefF. The RefT and RefF clocks have the same clock frequency as the Ref clock. The phase splitter circuit 512 receives a feedback clock Fb and provides complementary reference clocks FbT and FbF. The FbT and FbF clocks have the same clock frequency as the Fb clock. In some embodiments of the disclosure the phase splitter circuit 510 and 512 include a first clock path having two series coupled inverter circuits and include a second clock path having three series coupled inverter circuits. The phase splitter circuits 510 and 512 may include alternative circuits in other embodiments of the disclosure. The clock divider circuit 500 further includes divider circuits 520 and 522. The divider circuit 520 receives the RefT and RefF clocks from the phase splitter 510 and provides complementary divided clocks RefQ and RefQF. The divider circuit 522 receives the FbT and FbF clocks from the phase splitter 512 and provides complementary divided clocks FbQ and FbQF. The divided clocks RefQ and RefQF, and FbQ and FbQF have clock frequencies that are one-half the clock frequencies of the Ref and Fb clocks, respectively. The divider circuits 520 and 522 may be reset by an active reset signal Rf.

The RefQF clock is provided to a delay circuit 530 that delays the RefQF clock by one-half the clock period of the Ref clock before being provided as the RefDiv-h clock through series coupled inverter circuits 540 and 541 that provide a delayed RefQF clock RefL. The delay circuit 530 may be implemented as a D latch 530 that is clocked by the RefT and RefF clocks provided by the phase splitter 510, as shown in the embodiment of FIG. 5. A D flip-flop (DFF) may be used in pace of the D latch 530. The delay circuit 530 may be set or reset by an active reset signal Rf. Different types of delay circuits may be used in other embodiments without departing from the scope of the disclosure.

The RefQ clock is provided through series coupled inverter circuits 542 and 543 to an output circuit 560 as an RefQO clock. The output circuit 560 includes logic gates 562 and 564 coupled in series through which the RefQO clock propagates to provide the divided frequency clock RefDiv. The RefDiv clock has a clock frequency that is one-half the clock frequency of the Ref clock. The logic gates 562 and 564 may be series coupled NAND logic gates having an input coupled to a power supply voltage (e.g., VDD) in some embodiments of the disclosure, as shown in FIG. 5. Other types of logic gates and configurations may be used in other embodiments without departing from the scope of the disclosure.

The FbQ clock is provided through series coupled inverters 550 and 551 to provide output clock FbQO and the FbQF clock is provided through series coupled inverters 552 and 553 to provide output clock FbQFO. The FbQO and FbQFO clocks are provided to multiplexer circuit 570. The multiplexer circuit 570 includes logic gates 572, 574, and 576, and inverter circuits 573 and 575. The logic gate 572 is provided the FbQO clock at a first input and an output from the inverter circuit 573 at a second input. The logic gate 574 is provided the FbQFO clock at a first input and an output from the inverter circuit 575 at a second input. The logic gate 576 is provided the output of the logic gates 572 and 574, and the logic gate 576 provides the divided frequency clock FbDiv. The multiplexer circuit 570 provides the FbQO clock as the FbDiv clock when the output of the inverter circuit 573 is a high logic level (e.g., logic "1") and the multiplexer circuit 570 provides the FbQFO clock as the FbDiv clock when the output of the inverter circuit 573 is a low logic level (e.g., logic "0").

A phase detector 580 provides phase difference signal PD-o to the inverter circuit 573 to control the multiplexer 570 to provide the FbQO or FbQFO clock as the FbDiv clock. The PD-o signal provided by the phase detector 580 has a value (e.g., logic level) based on the phase relationship between the RefDiv-h clock and the FbQ clock. The RefDiv-h clock is provided to the phase detector 580 as the RefL clock and the FbQ clock is provided to the phase detector 580 through series coupled inverters 550 and 554 as the FbL clock. The phase detector 580 compares the RefL and FbL clocks to determine a phase relationship between the RefL and FbL clocks. The phase detector 580 provides the PD-o signal having a value indicative of the phase relationship between the RefL and FbL clocks. For example, when the RefL clock lags the FbL clock, the phase detector 580 provides the PD-o signal having a low logic level, and conversely, when the RefL clock leads the FbL clock, the phase detector 580 provides the PD-o signal having a high logic level.

In operation, the multiplexer 570 provides the FbQO clock as the FbDiv clock when the RefL clock lags the FbL clock (e.g., the PD-o signal is a low logic level). The multiplexer 570 provides the FbQFO clock as the FbDiv clock when the RefL clock leads the FbL clock (e.g., the PD-o signal is a high logic level).

The FbQO and FbQFO clocks include a propagation delay of the multiplexer 570 when provided as the FbDiv clock. The propagation delay of the multiplexer 570 is matched by a propagation delay of the output circuit 560 that provides the RefQO clock as the RefDiv clock. As a result, the relative phases of the RefQO and FbQO/FbQFO clocks are maintained when provided as the RefDiv and FbDiv clocks, respectively. Propagation delays when providing the RefQ clock as the RefQO clock, when providing the FbQ clock as the FbQO clock, and when providing the FbQF clock as the FbQFO clock are matched by including the series coupled inverter circuits 542 and 543, 550 and 551, and 552 and 553. As a result, the relative phases of the RefQ, FbQ, and FbQF clocks are maintained when provided as the RefQO, FbQO, and FbQFO clocks, respectively.

In some embodiments of the disclosure, the clock divider circuit 500 may include dummy circuits that are used to balance loading (e.g., capacitance, resistance, etc.) of other circuits that provide one or more of the clocks previously described. Balancing the loading may help maintain phase relationships of the clocks of the Ref/RefDiv clock path (e.g., circuits and gates between receiving the Ref clock and providing the RefDiv clock) with the clocks of the Fb/FbDiv clock path (e.g., circuits and gates between receiving the Fb clock and providing the FbDiv clock).

For example, FIG. 5 shows an embodiment of the clock divider circuit 500 including dummy circuit D530 that balances the loading caused by the delay circuit 530. Balancing the loading may help with maintaining the relative phases of the RefT/RefF clocks with the FbT/FbF clocks. In some embodiments of the disclosure, the dummy circuit D530 may include the same circuits as included in delay circuit 530 to mimic the loading of the delay circuit 530. The clock divider circuit 500 of FIG. 5 is shown to also include dummy circuit D541, D543, and D554 that balance loading caused by the inverter circuit 554. Balancing the loading may help with maintaining the relative phases of the RefQ, FbQ, and FbQF clocks when providing the RefQO, FbQO, FbQFO, RefL, and FbL clocks.

Although the embodiment of the clock divider circuit 500 is shown in FIG. 5 as including the previously described matched circuits and dummy circuits, other embodiments of the disclosure may include different combinations of the dummy and matched circuits previously described, and may also include additional and/or alternative dummy circuits for balancing loading and matching propagation delay without departing from the scope of the disclosure. The previous dummy and matched circuits have been described by way of example and are not intended to limit the scope of the disclosure to the particular embodiment shown in FIG. 5.

The clock divider circuit 500 provides clocks having lower clock frequency (e.g., one-half the clock frequency of an input clock), which may result in greater margin for a phase detector of a DLL in detecting the relative phases of a reference clock and a feedback clock based on the reference clock. As previously described, conventional clock divider circuits provide divided clocks that may have unpredictable phase relationships that cause long lock scenarios. However, in contrast to conventional clock divider circuits, the clock divider circuit 500 provides one of two feedback clocks based on the phase relationship between the reference and feedback clocks (which may be represented by clocks based on the reference and feedback clocks). In some embodiments of the disclosure, the reference and feedback clocks may be represented by a clock based on the reference clock (e.g., the RefL clock) and one of the two feedback clocks (e.g., the FbL clock). The selected feedback clock may reduce the likelihood of long lock scenarios.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
a first circuit configured to provide a first intermediate clock responsive, at least in part, to a first input clock, the first intermediate clock being lower in frequency than the first input clock;
a second circuit configured to provide a second intermediate clock and a third intermediate clock responsive, at least in part, to a second input clock, the second intermediate clock being complementary to the third intermediate clock and lower in frequency than the second input clock; and
a third circuit configured to receive the second and third intermediate clocks, receive, based, at least in part, on a comparison between the first intermediate clock delayed and the second intermediate clock, an enable signal, select as an output clock one of the second and third intermediate clocks received by the third circuit responsive to the enable signal, and provide the output clock.

2. The apparatus of claim 1, further comprising:
a delay circuit configured to delay the first intermediate clock to produce the delayed first intermediate clock; and
a phase detector configured to compare a phase of the delayed first intermediate clock and the second intermediate clock.

3. The apparatus of claim 2, wherein the first intermediate clock has a frequency that is a half of a frequency of the first input clock, wherein each of the second and third intermediate clocks has a frequency that is a half of a frequency of the second input clock, and
wherein the delay circuit is configured to delay the first intermediate clock by a half clock of the first input clock to produce the delayed first intermediate clock.

4. The apparatus of claim 2, wherein the phase detector is further configured to provide an output having a value indicative of a phase relationship between the delayed first intermediate clock and the second intermediate clock to control selection of one of the second and third intermediate clocks.

5. The apparatus of claim 1, further comprising a delay circuit including at least one of a D latch and a D flip-flop clocked by complementary clocks that are based on the first input clock.

6. The apparatus of claim 1, further comprising:
a first phase splitter coupled to receive the first input clock and provide first complementary input clocks responsive, at least in part, to the first input clock; and
a second phase splitter coupled to receive the second input clock and provide second complementary clocks responsive, at least in part, to the second input clock.

7. An apparatus, comprising:
a clock divider circuit configured to receive a first input clock and provide a first output clock responsive at least in part to the first input clock, the first output clock having a lower frequency than the first input clock, the clock divider circuit further configured to receive a second input clock and provide a second output clock responsive at least in part to the second input clock, the second output clock having a lower frequency than the second input clock,
wherein the second output clock is selected based, at least in part, on a comparison between a first divided clock and a second divided clock, and the first divided clock is provided at least in part to the first input clock, and
wherein the second output clock is selected from the second divided clock and a third divided clock that are provided responsive at least in part to the second input clock.

8. The apparatus of claim 7, further comprising:
a phase detector coupled to receive the first and second output clocks and configured to compare a phase of the first and second clocks and provide a phase difference signal having a value indicative of the phase of the first and second clocks;
a delay adjustment circuit coupled to receive the phase difference signal and the first input clock and configured to delay the first input clock based at least in part on the phase difference signal to provide a synchronized output clock; and
a replica circuit coupled to receive the synchronized output clock and configured to delay the synchronized output clock to provide the second input clock to the clock divider circuit.

9. The apparatus of claim 8, further comprising:
a duty cycle adjuster circuit coupled to receive the first input clock and configured to correct a duty cycle of the first input clock and provide a duty cycle corrected first input clock to the delay adjustment circuit.

10. The apparatus of claim 7, wherein the clock divider circuit includes:
a first divider circuit coupled to receive the first input clock and configured to provide the first divided clock having a lower clock frequency than the first input clock; and a second divider circuit coupled to receive the second input clock and configured to provide the second divided clock and the third divided clock, wherein the second and third divided clocks are complementary and have a lower clock frequency than the second input clock.

11. The apparatus of claim 10, wherein the clock divider circuit further includes:

a delay circuit coupled to the first divider circuit to receive the first divided clock and configured to delay the first divided clock by one-half a clock period of the first input clock to provide a delayed first divided clock.

12. The apparatus of claim 11, wherein the clock divider circuit further includes a dummy circuit coupled to the second divider circuit and configured to balance loading of the delay circuit.

13. The apparatus of claim 7, wherein the clock divider circuit further includes:

an output circuit coupled to receive the first divided clock and provide the first output clock; and a multiplexer configured to provide the second output clock, and wherein the output circuit includes a propagation delay matched to a propagation delay of the multiplexer configured to provide the second output clock.

14. The apparatus of claim 7, wherein the clock divider circuit includes:

a first divider circuit coupled to receive the first input clock and configured to provide the first divided clock having a lower clock frequency than the first input clock;

a second divider circuit coupled to receive the second input clock and configured to provide the second divided clock and the third divided clock, wherein the second and third divided clocks are complementary and have a lower clock frequency than the second input clock; and a multiplexer coupled to receive the second and third divided clocks and configured to provide the second divided clock as the second output clock responsive, at least in part, to falling clock edges of the first input clock lagging rising clock edges of the second input clock and to provide the third divided clock as the second output clock responsive, at least in part, falling clock edges of the first input clock leading rising clock edges of the second input clock.

15. A method, comprising:

dividing clock frequency of a first clock to provide a first divided clock;

providing the first divided clock as a first output clock;

dividing clock frequency of a second clock to provide a second divided clock;

providing, with propagation delays that are matched, the second divided clock and a third divided clock complementary to the second divided clock;

selecting the second divided clock to be provided as a second output clock responsive, at least in part, to a first phase relationship between the first clock and the second clock;

selecting the third divided clock to be provided as the second output clock responsive, at least in part, to a second phase relationship between the first clock and the second clock; and providing the second output clock.

16. The method of claim 15, wherein dividing the clock frequency of the first clock to provide a first divided clock includes dividing the clock frequency of the first clock by one-half to provide the first divided clock having one-half the clock frequency of the first clock.

17. The method of claim 15, further comprising:

delaying the first divided clock by one-half a clock period of the first divided clock to provide a delayed first divided clock;

comparing relative phases of the delayed first divided clock with the second divided clock;

providing a selection signal having a first value responsive, at least in part, to the delayed first divided clock lagging the second divided clock;

providing the selection signal having a second value responsive, at least in part, to the delayed first divided clock leading the second divided clock; and selecting between the second and third divided clocks based on the value of the selection signal.

18. The method of claim 15, wherein the first phase relationship includes falling clock edges of the first clock lagging rising clock edges of the second clock, and wherein the second phase relationship includes falling clock edges of the first clock leading rising clock edges of the second clock.

* * * * *